United States Patent
Yen et al.

(10) Patent No.: US 12,394,675 B2
(45) Date of Patent: Aug. 19, 2025

(54) METHOD AND SYSTEM FOR MONITORING AND CONTROLLING SEMICONDUCTOR PROCESS

(71) Applicant: Winbond Electronics Corp., Taichung (TW)

(72) Inventors: Ying-Chu Yen, Taichung (TW); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 544 days.

(21) Appl. No.: 17/881,635

(22) Filed: Aug. 5, 2022

(65) Prior Publication Data
US 2023/0076269 A1     Mar. 9, 2023

(30) Foreign Application Priority Data
Sep. 9, 2021  (TW) ................................ 110133570

(51) Int. Cl.
*H01L 21/67* (2006.01)
*H01L 21/66* (2006.01)
*H10B 12/00* (2023.01)

(52) U.S. Cl.
CPC ........ *H01L 22/20* (2013.01); *H01L 21/67259* (2013.01); *H10B 12/053* (2023.02)

(58) Field of Classification Search
CPC ... H01L 22/12; H01L 22/20; H01L 21/67259; H10B 12/053
See application file for complete search history.

(56) References Cited

U.S. PATENT DOCUMENTS

| | | | |
|---|---|---|---|
| 7,080,330 B1 | 7/2006 | Choo et al. | |
| 7,381,575 B2 | 6/2008 | Wu et al. | |
| 2019/0019795 A1* | 1/2019 | Takesako | H01L 23/528 |
| 2019/0348420 A1* | 11/2019 | Yen | H01L 21/76802 |

FOREIGN PATENT DOCUMENTS

| | | | | |
|---|---|---|---|---|
| CN | 103515265 | | 1/2014 | |
| CN | 212135137 U | * | 12/2020 | G03F 1/70 |
| CN | 110931485 B | * | 6/2024 | H10B 99/00 |
| TW | I229913 | | 3/2005 | |

* cited by examiner

*Primary Examiner* — Nelson Garces
(74) *Attorney, Agent, or Firm* — JCIPRNET (57) ABSTRACT

A method and system for monitoring and controlling a semiconductor process are provided. The method includes: forming at least one active region on a substrate; forming a first patterned photoresist layer for defining at least two word lines on the active region after forming the active region; detecting and measuring positions and dimensions of the active region and the first patterned photoresist layer and calculating estimated areas of at least two estimated contact windows in the active region according to a predefined position of at least one bit line; adjusting the predefined position of the at least one bit line according to the estimated areas of the at least two estimated contact windows in the active region; and forming a second patterned photoresist layer on the substrate. The second patterned photoresist layer corresponds to the adjusted predefined position of the at least one bit line.

10 Claims, 8 Drawing Sheets

METHOD AND SYSTEM FOR MONITORING AND CONTROLLING SEMICONDUCTOR PROCESS

CROSS-REFERENCE TO RELATED APPLICATION

This application claims the priority benefit of Taiwan application serial no. 110133570, filed on Sep. 9, 2021. The entirety of the above-mentioned patent application is hereby incorporated by reference herein and made a part of this specification.

BACKGROUND

Technical Field

The disclosure relates to a technology for monitoring and controlling a semiconductor process, and in particularly, relates to a method and system for monitoring and controlling a semiconductor process.

Description of Related Art

The lithography technology is a key step in the semiconductor process and is used to define the position of each component on the substrate. The lithography technology often becomes a bottleneck in the semiconductor process as a result. In the lithography technology, good alignment and control of critical circuit dimensions have a significant impact on product yield.

Therefore, in semiconductor manufacturing, how to check whether the components in the process generate unexpected overlap and then take corresponding correction methods together with the implementation of the process steps is an important issue.

SUMMARY

The disclosure provides a method and system for monitoring and controlling a semiconductor process capable of providing a uniform configuration of contact areas of two contact windows in two memory cells sharing an active region.

According to the disclosure, a method for monitoring and controlling a semiconductor process includes the following steps. At least one active region is formed on a substrate. After the at least one active region is formed, a first patterned photoresist layer for defining at least two word lines is formed on the at least one active region. Positions and dimensions of the at least one active region and the first patterned photoresist layer are detected and measured, and estimated areas of at least two estimated contact windows in the at least one active region are calculated according to a predefined position of at least one bit line. The predefined position of the at least one bit line is adjusted according to the estimated areas of the at least two estimated contact windows in the at least one active region. A second patterned photoresist layer is formed on the substrate. The second patterned photoresist layer corresponds to the adjusted predefined position of the at least one bit line.

According to the disclosure, a system for monitoring and controlling a semiconductor process includes semiconductor manufacturing equipment and a controller. The semiconductor manufacturing equipment is configured for manufacturing an integrated circuit on a substrate. The controller is coupled to the semiconductor manufacturing equipment. The controller controls the semiconductor manufacturing equipment to perform the following operations. At least one active region is formed on the substrate. After the at least one active region is formed, a first patterned photoresist layer for defining at least two word lines is formed on the at least one active region. Positions and dimensions of the at least one active region and the first patterned photoresist layer are detected and measured, and estimated areas of at least two estimated contact windows in the at least one active region are calculated according to a predefined position of at least one bit line. The predefined position of the at least one bit line is adjusted according to the estimated areas of the at least two estimated contact windows in the at least one active region. A second patterned photoresist layer is formed on the substrate. The second patterned photoresist layer corresponds to the adjusted predefined position of the at least one bit line.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
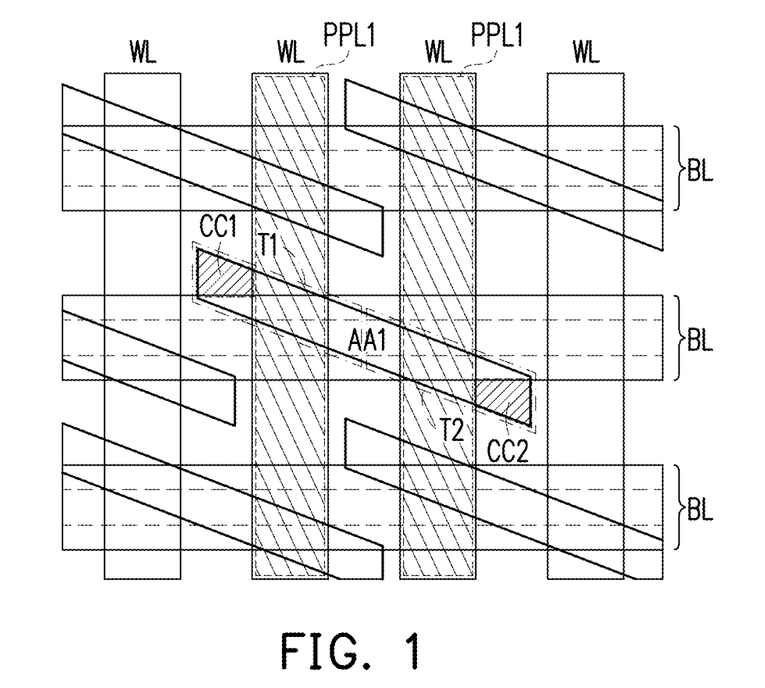
FIG. 1 is a schematic diagram of a layout of active regions, word lines, and bit lines of a dynamic random access memory according to an embodiment of the disclosure.

FIG. 1 is a schematic diagram of a layout of active regions, word lines, and bit lines of a dynamic random access memory according to an embodiment of the disclosure. In this embodiment, the layout of the dynamic random access memory is that two memory cells share a bit line BL, and the two memory cells are controlled by two word lines WL. When the dynamic random access memory is manufactured, areas of contact windows CC1 and CC2 corresponding to the two word lines WL in the two memory cells may not be uniformly arranged due to the imprecision of the lithography technology, and that a bridging margin of the contact windows is thereby lowered.

In the structure of FIG. 1, the lithography technology in the semiconductor process is combined to describe this embodiment. First, shallow trench isolation (STI) is used to form a plurality of active regions AA1 separated from each other on a substrate, and the active regions AA1 are configured in a strip shape and are arranged in an array. After the active regions AA1 are formed, a patterned photoresist layer for defining the word lines WL is formed on the substrate by using the lithography technology, so as to prepare for the formation of the word lines WL. Next, an etching process is performed to form the word lines WL in the substrate. The word lines WL are presented in a column direction. After the word lines WL are formed, a patterned photoresist layer for defining the bit lines BL is formed on the substrate by using the lithography technology, so as to prepare for the formation of the bite lines BL. Next, an etching process is performed to form the bit lines BL on the substrate. The bit lines BL are presented in a row direction. Based on the aforementioned process, two memory cells share one active region AA1, and two word lines WL cross the active region AA1, so that two switching transistors T1 and T2 are accordingly generated. Therefore, capacitive elements of the memory cells may be connected to the bit lines BL through the contact windows CC1 and CC2 and the switching transistors T1 and T2.

If the connection between the contact windows CC1 and CC2 and the corresponding capacitive elements is required to be known, areas of the contact windows CC1 and CC2 may be measured with an electron microscope only after the aforementioned semiconductor process is sequentially stacked in accordance with the order of forming the active region, the word lines WL, and the bit lines BL. Nevertheless, after the connection of the contact windows CC1 and CC2 is known, positions of the word lines WL and the bit lines BL in this semiconductor process cannot be adjusted immediately.

Figure 2:
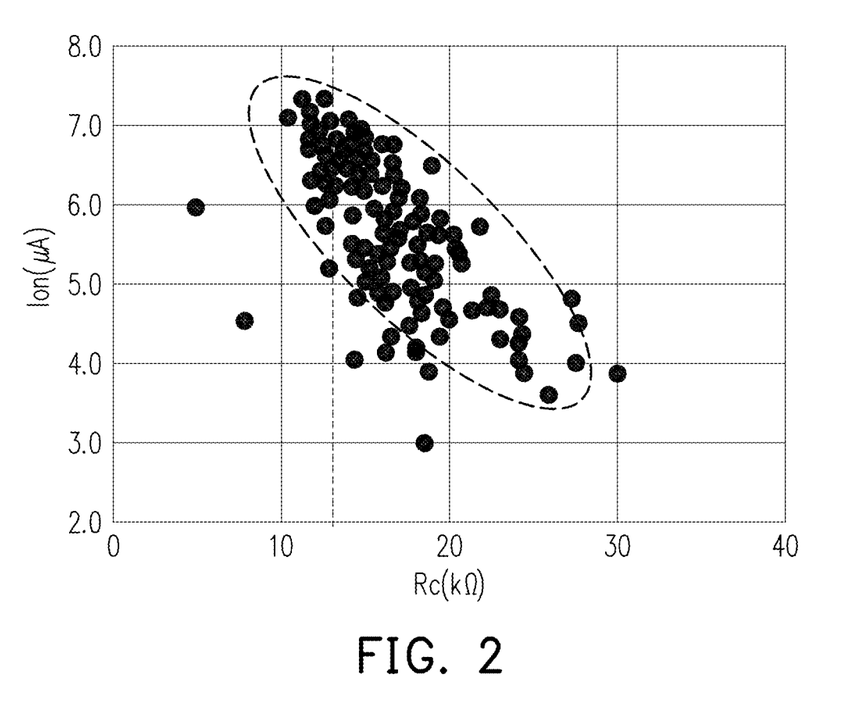
FIG. 2 is a schematic graph illustrating a relationship between a resistance Re and a turn-on voltage Ion of a contact window according to an embodiment of the disclosure.

FIG. 2 is a schematic graph illustrating a relationship between a resistance Rc and a turn-on voltage Ion of a contact window according to an embodiment of the disclosure. The horizontal axis represents the resistance Rc of the contact window, and the unit is kΩ. The vertical axis represents the value of a turn-on current Ion between the contact window and a capacitive element, and the unit is μA. When the area of the contact window with the capacitive element increases, the resistance value Rc of the contact window decreases, and the turn-on current Ion between the contact window and the capacitive element increases. In contrast, when the area of the contact window with the capacitive element decreases, the resistance value Rc of the contact window increases, and the turn-on current Ion between the contact window and the capacitive element decreases. Therefore, it is desirable to allow the contact windows CC1 and CC2 in the same active region AA1 to have similar areas, and in this way, the turn-on currents of the capacitive elements of the memory cells connected to the bit lines BL via the switching transistors T1 and T2 in the active region AA1 may be consistent.

Figure 3A:
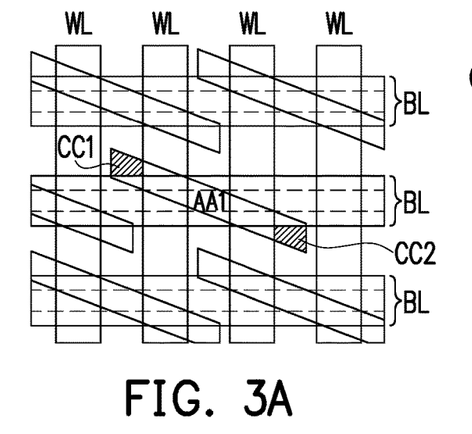
FIG. 3A to FIG. 3D are schematic diagrams illustrating overlay measurement of the word lines and the bit lines with respect to contact areas of contact windows in an active region according to an embodiment of the disclosure.
Figure 3B:
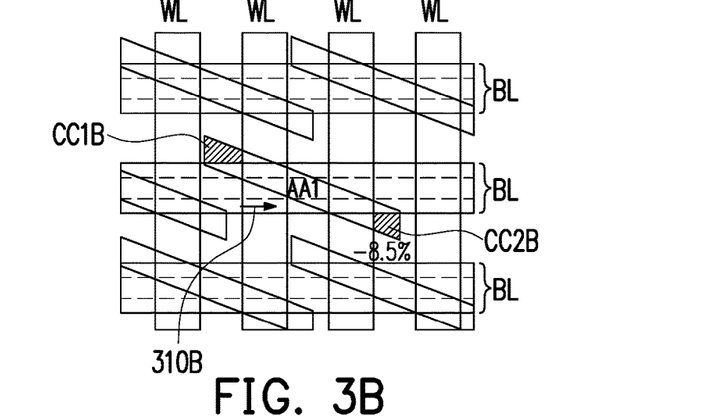
Figure 3C:
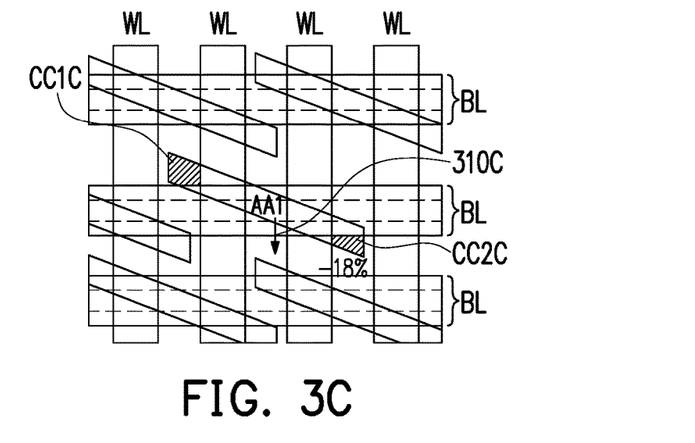
Figure 3D:
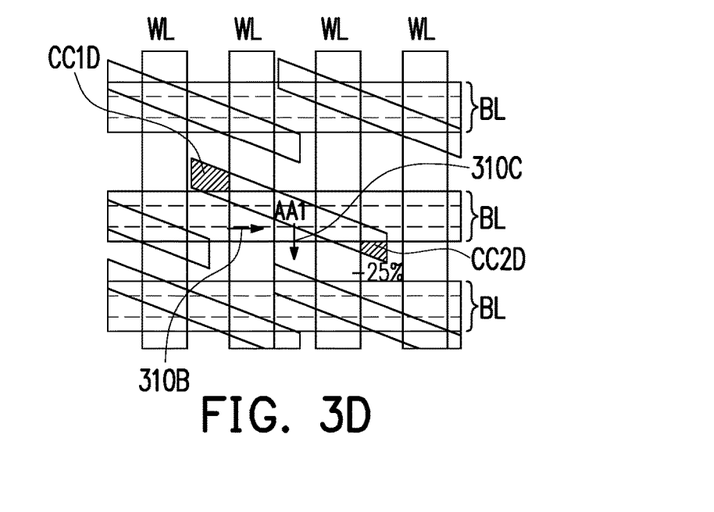

FIG. 3A to FIG. 3D are schematic diagrams illustrating overlay measurement of the word lines WL and the bit lines BL with respect to contact areas of contact windows CC1 and CC2 in the active region AA1 according to an embodiment of the disclosure. FIG. 3A is a schematic diagram of the active region AA1 and the contact windows CC1 and CC2 in FIG. 1. FIG. 3B presents a schematic diagram of shifting overlaying positions of the word lines WL in FIG. 3A to the right (i.e., the positive direction of the X axis) by 3 nm, as shown by the arrow 310B. In this embodiment, based on calculation, a contact window CC2B has a reduced area of approximately 8.5% compared to a contact window CC1B. FIG. 3C presents a schematic diagram of shifting overlaying positions of the bit lines BL in FIG. 3A downwards (i.e., the negative direction of the Y axis) by 3 nm, as shown by the arrow 310C. In this embodiment, based on calculation, a contact window CC2C has a reduced area of approximately 18% compared to a contact window CC1C. FIG. 3D presents a schematic diagram of shifting the overlaying positions of the word lines WL in FIG. 3A to the right (i.e., the positive direction of the X axis) by 3 nm (as shown by the arrow 310B) and shifting the overlaying positions of the bit lines BL downwards (i.e., the negative direction of the Y axis) by 3 nm (as shown by the arrow 310C). In this embodiment, based on calculation, a contact window CC2D has a reduced area of approximately 25% compared to a contact window CC1D.

Figure 4:
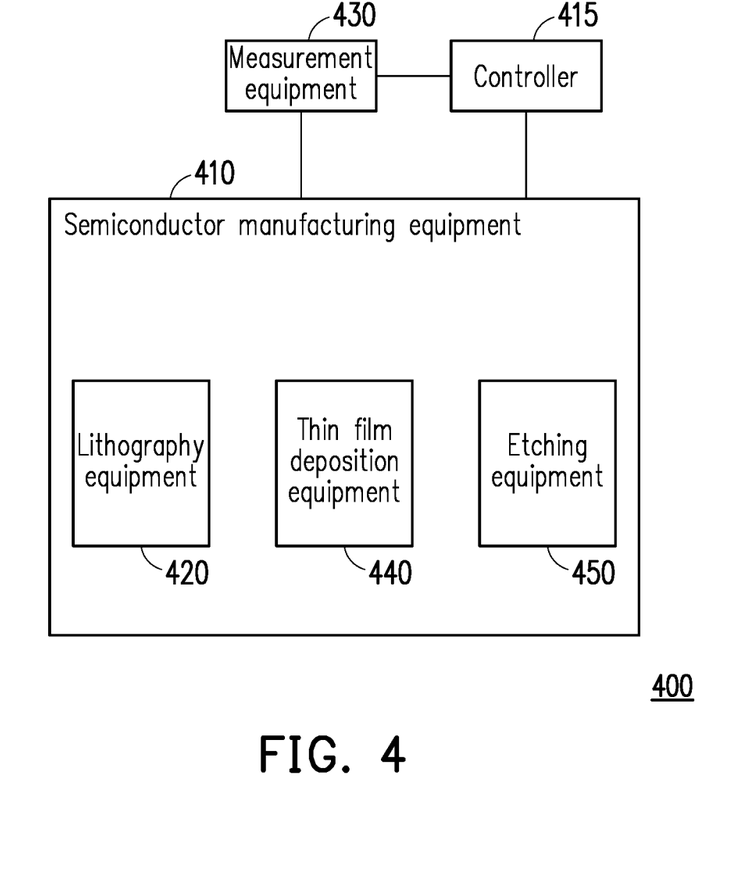
FIG. 4 is a block diagram of a system for monitoring and controlling a semiconductor process according to an embodiment of the disclosure.

FIG. 4 is a block diagram of a system for monitoring and controlling a semiconductor process according to an embodiment of the disclosure. A system for monitoring and controlling a semiconductor process 400 includes semiconductor manufacturing equipment 410, measurement equipment 430, and a controller 415. The semiconductor manufacturing equipment 410 includes lithography equipment 420, thin film deposition equipment 440, etching equipment 450, and related equipment. The semiconductor manufacturing equipment 410 is used to manufacture an integrated circuit on a substrate through many pieces of equipment (e.g., equipment 420, 440, 450, etc.). The controller 415 is coupled to the equipment 420, 440, and 450 in the semiconductor manufacturing equipment 410 and is configured to implement a method for monitoring and controlling a semiconductor process provided in this embodiment. In some embodiments, the controller 415 is mainly configured for controlling the steps of the lithography equipment 420 and may be located inside the lithography equipment 420 of the semiconductor manufacturing equipment 410. The measurement equipment 430 at least includes measuring the critical dimension (CD) and overlay registration (RG) of each structure or photoresist layer on the substrate, so as to obtain the position and dimension of each structure or photoresist layer.

Figure 5A:
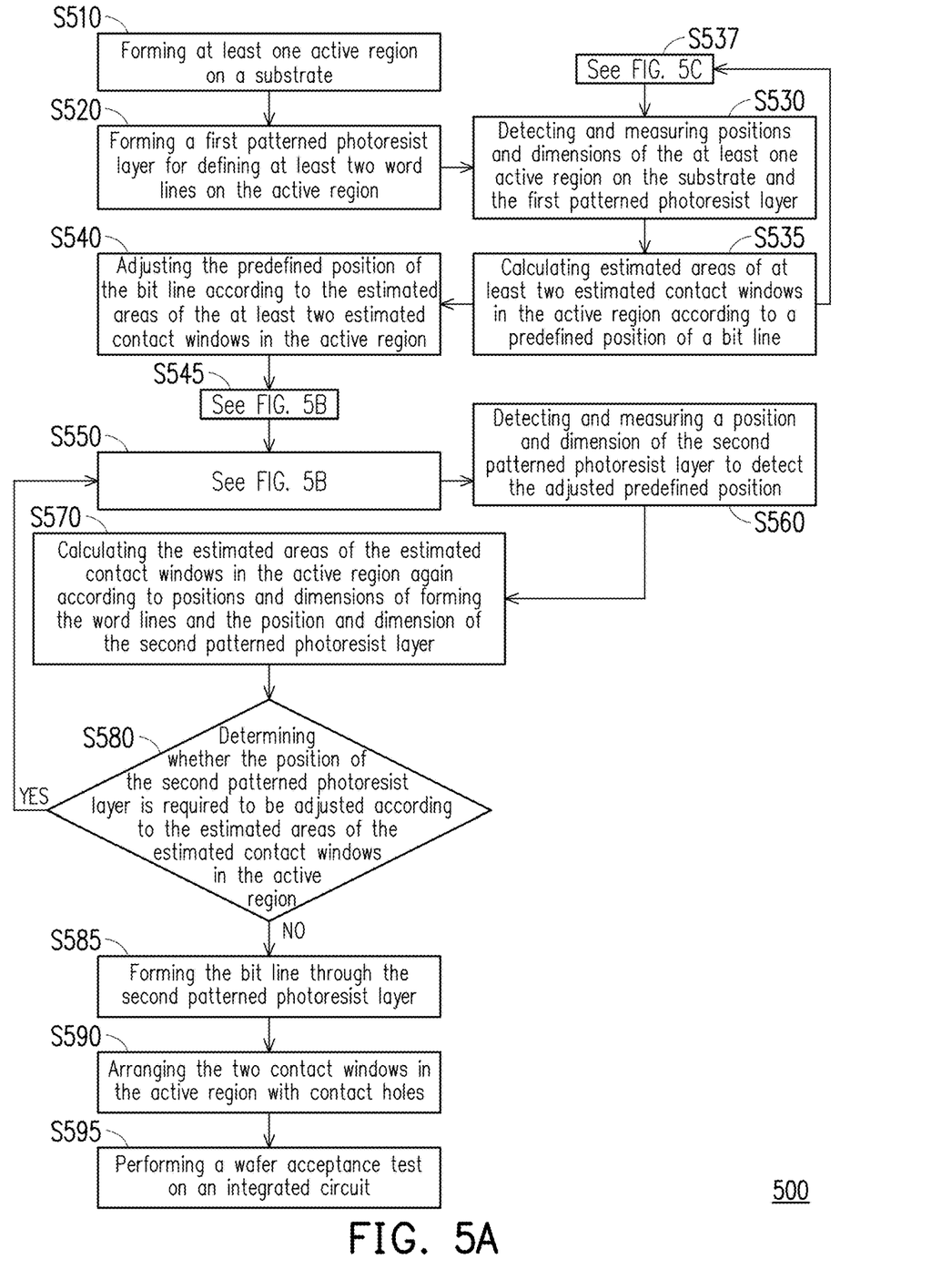
FIG. 5A to FIG. 5C are flow charts of a method for monitoring and controlling a semiconductor process according to an embodiment of the disclosure.
Figure 5B:
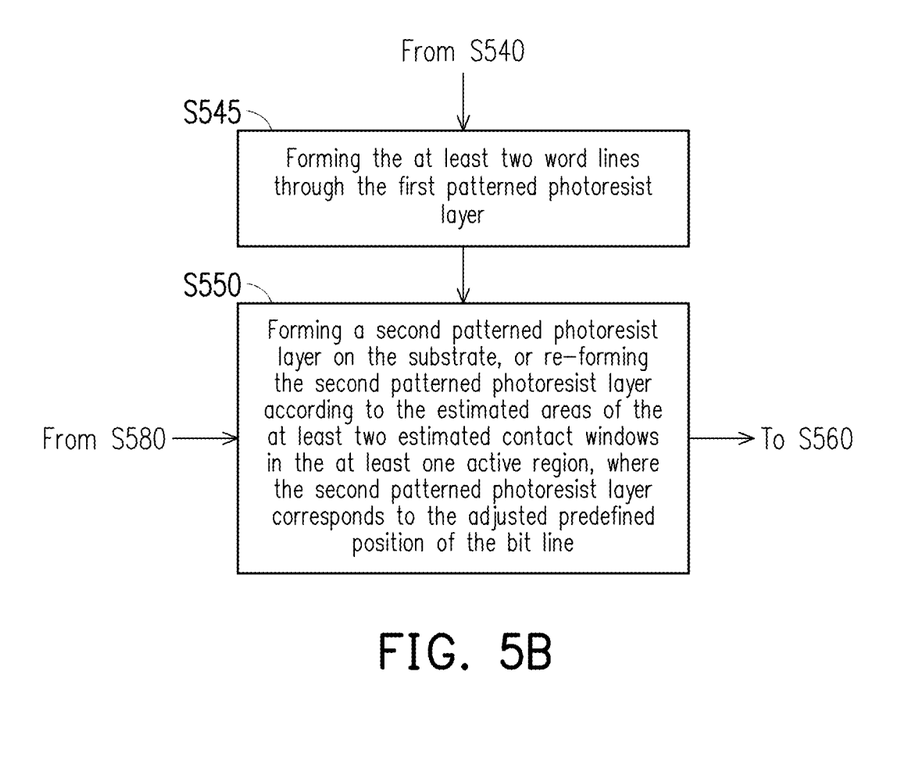
Figure 5C:
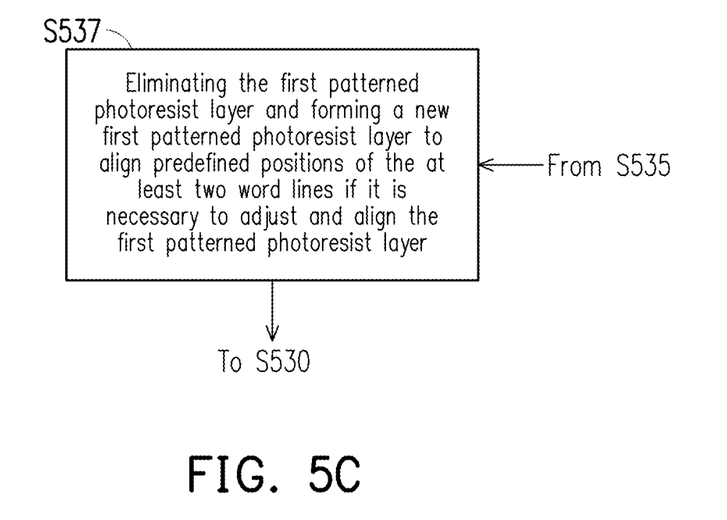

FIG. 5A to FIG. 5C are flow charts of a method for monitoring and controlling a semiconductor process according to an embodiment of the disclosure. With reference to FIG. 4 and FIG. 5A to FIG. 5C together, the semiconductor manufacturing equipment 410 forms at least one active region on a substrate (step S510). After the active region is formed, in step S520, the lithography equipment 420 forms a first patterned photoresist layer (e.g., the first patterned photoresist layers PPL1 related to the active regions AA1 in FIG. 1) for defining at least two word lines on the active region. The word lines WL extend in a first direction, the bit lines BL extend in a second direction, and the first direction and the second direction are not parallel to each other. In this embodiment, the first direction and the second direction are perpendicular to each other.

In step S530, the measurement equipment 430 detects and measures positions and dimensions of the at least one active region (e.g., the active region AA1 shown in FIG. 1) and the first patterned photoresist layer (e.g., the patterned photoresist layers PPL1 in FIG. 1). Further, in step S535, the controller 415, according to a predefined position of at least one bit line BL, calculates estimated areas of at least two estimated contact windows (e.g., the contact windows CC1 and CC2 shown in FIG. 1) in the active region. In other words, based on the position and dimension of the first patterned photoresist layer formed in the active region on the substrate, the controller 415 may simulate and calculate the estimated areas of estimated contact windows in line with an expected position (i.e., the aforementioned "predefined position") of the at least one bit line BL. In this embodiment, the measurement equipment 430 calculates the estimated areas of the estimated contact windows based on a critical dimension (CD) and overlay (OVL) of the active region/first patterned photoresist layer. When the lithography equipment 420 forms the first patterned photoresist layer, some errors are still inevitably generated. Therefore, the measurement equipment 430 may be used in step S530 to detect and measure the positions and dimensions of the active region and the first patterned photoresist layer, so as to determine the errors caused by the lithography equipment 420 when forming the first patterned photoresist layer and to calculate the estimated areas of the two estimated contact windows.

In step S540, the controller 415 adjusts the predefined position of the bit line BL according to the estimated areas of the at least two estimated contact windows in the active region. Before step S550 is performed, in step S545 of FIG. 5A and FIG. 5B, the etching equipment 450 in the semiconductor manufacturing equipment 410 forms the word lines WL through the first patterned photoresist layer and the thin film deposition equipment 440. In step S550 of FIG. 5A and FIG. 5B, the controller 415 controls the lithography equipment 420 to form a second patterned photoresist layer (e.g., the patterned photoresist layer PPL2 in FIG. 1) on the substrate. The second patterned photoresist layer PPL2 corresponds to the adjusted predefined position of the bit line BL, so that the estimated areas of the two estimated contact windows are approximately the same.

Figure 6A:
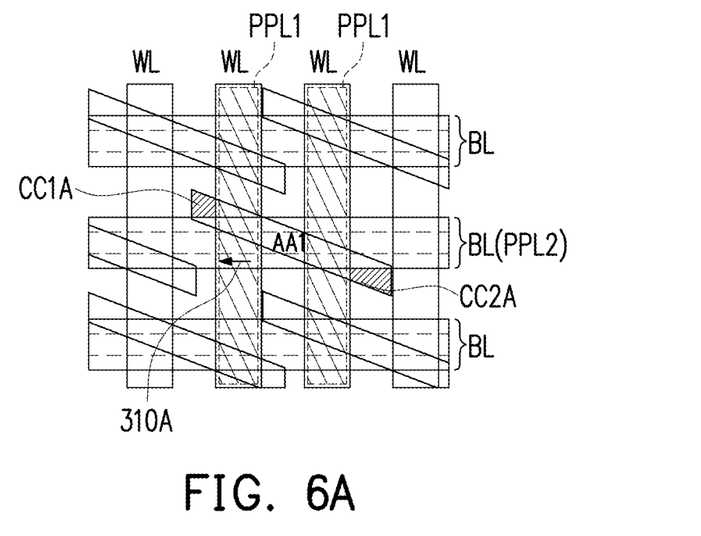
FIG. 6A and FIG. 6B are schematic diagrams of adjustment of the contact areas of the contact windows through movement of a predefined position of a bit line according to an embodiment of the disclosure.
Figure 6B:
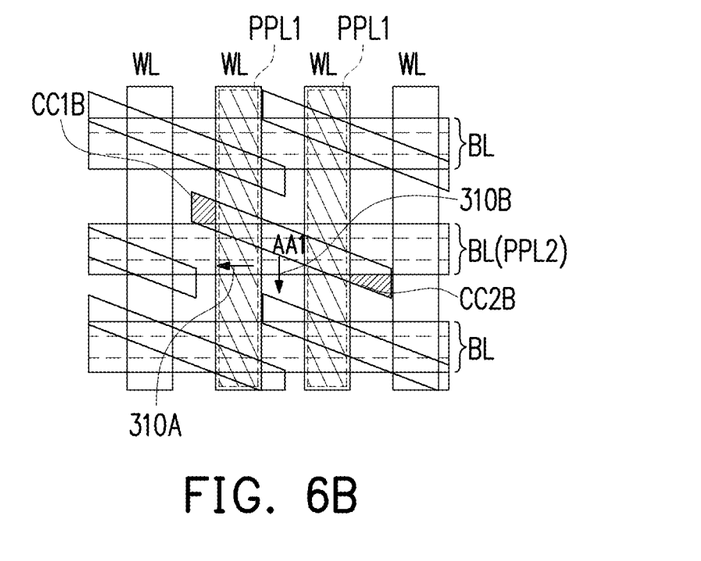

FIG. 6A and FIG. 6B are schematic diagrams of adjustment of the contact areas of the contact windows through movement of a predefined position of a bit line according to an embodiment of the disclosure. As shown in FIG. 6A, due to the error of the lithography technology, the word line WL is shifted to the left by 4 nm (as indicated by the arrow 310A), resulting in the area of a contact window CC1A being slightly smaller than the area of a contact window CC2A. Therefore, in this embodiment, on the premise that the word line WL is shifted to the left by 4 nm, the predefined position of the bit line BL is adjusted in FIG. 6B, so that the bit line BL is shifted downwards by 2.5 nm (as indicated by the arrow 310B), so as to make the area of a contact window CC1B as close as possible to the area of a contact window CC2B.

With reference to FIG. 5A again, when the adjusted predefined position of the bit line BL is formed on the substrate in the form of the second patterned photoresist layer PPL2 through the lithography equipment 420, there may inevitably be some errors. Therefore, in this embodiment, the measurement equipment 430 may further be used in step S560 to detect and measures a position and dimension of the second patterned photoresist layer PPL2 to detect the adjusted predefined position. Moreover, in step S570, the controller 415 calculates the estimated areas of the estimated contact windows in the active region again according to the positions and dimensions of forming the word lines and the position and dimension of the second patterned photoresist layer. Next, in step S580, the controller 415 determines whether the position of the second patterned photoresist layer PPL2 is required to be adjusted according to the estimated areas of the estimated contact windows in the active region. If the controller 415 determines that the position of the second patterned photoresist layer is not required to be adjusted in step S580 (i.e., no is determined in step S580), step S585 is performed next. In contrast, if the controller 415 determines that the position of the second patterned photoresist layer PPL2 is required to be adjusted in step S580 (i.e., yes is determined in step S580), the arranged second patterned photoresist layer PPL2 is eliminated, and step S550 is to be performed again. In step S550 of FIG. 5A and FIG. 5B, a second patterned photoresist layer PPL2 is re-formed, and this second patterned photoresist layer PPL2 corresponds to the adjusted predefined position of the bit line BL.

In this embodiment, step S550 to step S580 may be performed multiple times and repeatedly to perform fine adjustment of the second patterned photoresist layer according to requirements of applications of this embodiment. Alternatively, it may be evaluated whether various parameters in the semiconductor process are modified according to detection and measurement results in step S560. In this way, the problem of insufficient contact areas of the contact windows in the memory cells caused by the errors of the lithography technology may be compensated by adjustment of the predefined position of the bit line BL, and the product yield in the semiconductor process may thus be increased.

Before the second patterned photoresist layer is formed, in step S585, the etching equipment 450 in the semiconductor manufacturing equipment 410 forms the bit line BL through the second patterned photoresist layer. In step S590, the semiconductor manufacturing equipment 410 arranges contact holes on the two contact windows in the active region, so as to be coupled to the corresponding capacitive elements of the memory cells, and that the structure of the random access memory is completed. In step S595, a wafer acceptance test (WAT) is performed on the completed integrated circuit to obtain electrical parameters related to the integrated circuit, and in this way, it may be determined that whether the integrated circuit manufactured by this semiconductor process may operate normally and stably. In this embodiment, the resistance value Re and the turn-on current Ion of the contact windows CC1 and CC2 in FIG. 1 may be obtained through step S595, so as to determine whether a method 500 of FIG. 5 actually improves the quality of the product.

In some embodiments consistent with the disclosure, in addition to adjusting the position of the second patterned photoresist layer multiple times in steps S550 to S580, the controller 415 may also be used to perform step S520 again to adjust the first patterned photoresist layer multiple times before step S550 is performed. To be specific, if the controller 415 considers that it is necessary to adjust and align the first patterned photoresist layer with the predefined position of the word line WL, in step S537 of FIG. 5A and FIG. 5C from step S535, the controller 415 needs to eliminate the first patterned photoresist layer configured in step S520, forms a new first patterned photoresist layer next, and proceeds from step S520 to the remaining steps.

In some embodiments consistent with the disclosure, in step S530, by detecting and measuring the positions and dimensions of the at least one active region on the substrate and the first patterned photoresist layer, the estimated areas of the at least two estimated contact windows in the active region are calculated in step S535. In application of this embodiment, the positions and dimensions of the at least one active region on the substrate and the etched (i.e., formed) word lines may also be detected and measured to calculate the estimated areas of at least two estimated contact windows in the active region.

In this embodiment, it is expected that the estimated areas of the aforementioned two estimated contact windows may be similar to balance the two. To be specific, in this embodiment, it is expected that a shift k parameter ("BL OVL-Y shift k") of the bit line on an overlap y-axis is not correlated with an optimized overlap y-axis parameter ("OVL-Y$_{optimize}$"). The optimized overlap y-axis parameter ("OVL-Y$_{optimize}$") is calculated through formula, and the shift k parameter ("BL OVL-Y shift k") is optimized through the wafer acceptance test (WAT). If the shift k parameter ("BL OVL-Y shift k") is still correlated with the area balance of the two estimated contact windows, in application of this embodiment, shift k parameter ("BL OVL-Y shift k") is required to be adjusted, so that the area balance of the two estimated contact windows is independent of the shift k parameter ("BL OVL-Y shift k").

Figure 7A:
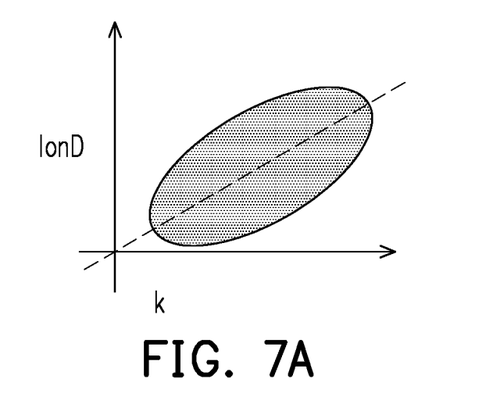
FIG. 7A, FIG. 7B, and FIG. 7C are graphs of relations between a shift k parameter and a turn-on voltage difference of the contact windows on both sides of a memory cell.
Figure 7B:
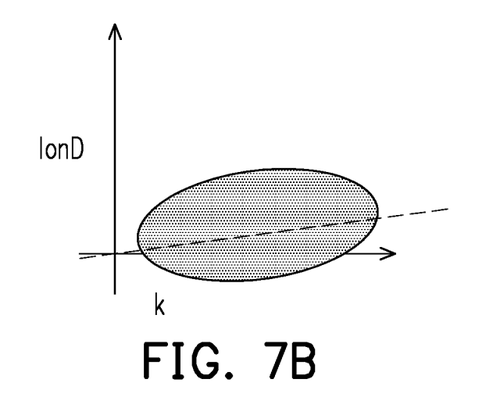
Figure 7C:
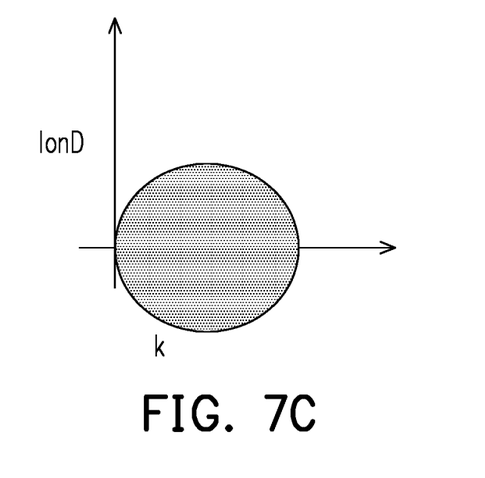

FIG. 7A, FIG. 7B, and FIG. 7C are graphs of relations between the shift k parameter ("BL OVL-Y shift k") and a turn-on voltage difference of the contact windows on both sides of a memory cell. The X axis represents the shift k parameter ("BL OVL-Y shift k"), and the Y axis represents a difference IonD between the turn-on voltages of the contact windows on both sides of the memory cell. FIG. 7A shows that there is still a positive correlation between the difference IonD between the turn-on voltages and the shift k parameter. In application of this embodiment, the shift k parameter may be optimized through the wafer acceptance test (WAT), and in this way, the correlation between the difference IonD between the turn-on voltages and the shift k parameter may be gradually adjusted from the positive correlation in FIG. 7A to the slightly positive correlation in FIG. 7B until it becomes non-correlation in FIG. 7C. As such, in application of this embodiment, the shift k parameter may also be optimized through the wafer acceptance test (WAT), and the correlation between the shift k parameter and the turn-on voltage difference of the contact windows on both sides of the memory cell may thereby be reduced.

In view of the foregoing, in the method and system for monitoring and controlling the semiconductor process provided by the embodiments of the disclosure, the areas of the contact windows used to be connected to the capacitive elements may be estimated by monitoring the positions and dimensions of the active region and the first patterned photoresist layer for defining the word lines (or the positions and dimensions of forming the word lines). Accordingly, the second patterned photoresist layer defining the bit line is correspondingly adjusted, so that the areas of the two contact windows corresponding to the two memory cells in the same active region are as similar as possible, and the product yield in the semiconductor process may thereby be increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for monitoring and controlling a semiconductor process, comprising:
   forming at least one active region on a substrate;
   forming a first patterned photoresist layer for defining at least two word lines on the at least one active region after forming the at least one active region;
   detecting and measuring positions and dimensions of the at least one active region and the first patterned photoresist layer and calculating estimated areas of at least two estimated contact windows in the at least one active region according to a predefined position of at least one bit line;
   adjusting the predefined position of the at least one bit line according to the estimated areas of the at least two estimated contact windows in the at least one active region; and
   forming a second patterned photoresist layer on the substrate, wherein the second patterned photoresist layer corresponds to the adjusted predefined position of the at least one bit line.

2. The method according to claim 1, further comprising:
   forming the at least two word lines through the first patterned photoresist layer before forming the second patterned photoresist layer.

3. The method according to claim 2, further comprising:
   detecting and measuring a position and dimension of the second patterned photoresist layer to detect the adjusted predefined position;
   calculating the estimated areas of the at least two estimated contact windows in the at least one active region again according to positions of forming the at least two word lines and the position and dimension of the second patterned photoresist layer; and
   re-forming the second patterned photoresist layer according to the estimated areas of the at least two estimated contact windows in the at least one active region, wherein the second patterned photoresist layer corresponds to the adjusted predefined position of the at least one bit line.

4. The method according to claim 2, further comprising:
   detecting and measuring positions and dimensions of the at least one active region and the formed the at least two word lines and calculating the estimated areas of the at least two estimated contact windows in the at least one active region according to the predefined position of the at least one bit line; and
   adjusting the predefined position of the at least one bit line according to the estimated areas of the at least two estimated contact windows in the at least one active region.

5. The method according to claim 1, wherein the at least two word lines cross the at least one active region, the at least one active region comprises two switching transistors, and each switching transistor comprises one of the at least two contact windows,
   wherein the at least two contact windows in the at least one active region are arranged with contact holes,
   wherein the at least two word lines are configured in a first direction, and the at least one bit line is configured in a second direction, wherein the first direction and the second direction are not parallel to each other.

6. The method according to claim 1, further comprising:
   eliminating the first patterned photoresist layer and forming a new first patterned photoresist layer to align predefined positions of the at least two word lines.

7. A system for monitoring and controlling a semiconductor process, comprising:
   semiconductor manufacturing equipment, configured for manufacturing an integrated circuit on a substrate; and
   a controller, coupled to the semiconductor manufacturing equipment,
   wherein the controller controls the semiconductor manufacturing equipment for:
   forming at least one active region on the substrate;

forming a first patterned photoresist layer for defining at least two word lines on the at least one active region after forming the at least one active region;

detecting and measuring positions and dimensions of the at least one active region and the first patterned photoresist layer and calculating estimated areas of at least two estimated contact windows in the at least one active region according to a predefined position of at least one bit line;

adjusting the predefined position of the at least one bit line according to the estimated areas of the at least two estimated contact windows in the at least one active region; and forming a second patterned photoresist layer on the substrate, wherein the second patterned photoresist layer corresponds to the adjusted predefined position of the at least one bit line.

8. The system according to claim 7, wherein the controller is further configured for:

forming the at least two word lines through the first patterned photoresist layer before forming the second patterned photoresist layer.

9. The system according to claim 8, wherein the controller is further configured for:

detecting and measuring a position and dimension of the second patterned photoresist layer to detect the adjusted predefined position;

calculating the estimated areas of the at least two estimated contact windows in the at least one active region again according to positions of forming the at least two word lines and the position and dimension of the second patterned photoresist layer; and re-forming the second patterned photoresist layer according to the estimated areas of the at least two estimated contact windows in the at least one active region, wherein the second patterned photoresist layer corresponds to the adjusted predefined position of the at least one bit line.

10. The system according to claim 7, wherein the at least two word lines cross the at least one active region, the at least one active region comprises two switching transistors, and each switching transistor comprises one of the at least two contact windows, wherein the at least two contact windows in the at least one active region are provided with contact holes, wherein the at least two word lines are configured in a first direction, and the at least one bit line is configured in a second direction, wherein the first direction and the second direction are not parallel to each other.

* * * * *